United States Patent
Lou et al.

(10) Patent No.: US 9,449,897 B2
(45) Date of Patent: Sep. 20, 2016

(54) CHIP PACKAGE AND METHOD FOR FORMING THE SAME

(71) Applicant: XINTEC INC., Jhongli, Taoyuan County (TW)

(72) Inventors: Bai-Yao Lou, Taipei (TW); Shih-Kuang Chen, Kaohsiung (TW); Sheng-Yuan Lee, Bade (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/198,542

(22) Filed: Mar. 5, 2014

(65) Prior Publication Data

US 2014/0252642 A1    Sep. 11, 2014

Related U.S. Application Data

(60) Provisional application No. 61/774,368, filed on Mar. 7, 2013.

(51) Int. Cl.
| | |
|---|---|
| H01L 21/78 | (2006.01) |
| H01L 23/48 | (2006.01) |
| H01L 23/31 | (2006.01) |
| H01L 21/56 | (2006.01) |

(52) U.S. Cl.
CPC .............. *H01L 23/48* (2013.01); *H01L 21/78* (2013.01); *H01L 23/3114* (2013.01); *H01L 21/561* (2013.01); *H01L 2924/0002* (2013.01)

(58) Field of Classification Search
CPC ... H01L 23/48; H01L 23/3114; H01L 21/78; H01L 21/561
See application file for complete search history.

(56) References Cited

U.S. PATENT DOCUMENTS

| | | | | |
|---|---|---|---|---|
| 5,773,879 | A * | 6/1998 | Fusayasu et al. | 257/678 |
| 6,566,745 | B1 * | 5/2003 | Beyne et al. | 257/680 |
| 6,956,283 | B1 * | 10/2005 | Peterson | 257/680 |
| 8,044,475 | B2 * | 10/2011 | Lin | H01L 27/14618 257/432 |
| 2002/0096421 | A1 * | 7/2002 | Cohn et al. | 200/181 |
| 2003/0151479 | A1 * | 8/2003 | Stafford et al. | 335/78 |
| 2003/0230798 | A1 * | 12/2003 | Lin et al. | 257/704 |
| 2004/0016995 | A1 * | 1/2004 | Kuo et al. | 257/678 |
| 2005/0121298 | A1 * | 6/2005 | Sridhar et al. | 200/181 |
| 2005/0170656 | A1 * | 8/2005 | Nasiri et al. | 438/700 |
| 2007/0020807 | A1 * | 1/2007 | Geefay et al. | 438/106 |
| 2007/0176280 | A1 * | 8/2007 | Do et al. | 257/692 |

(Continued)

FOREIGN PATENT DOCUMENTS

| | | |
|---|---|---|
| TW | 200834900 | 8/2008 |
| TW | 201103107 | 1/2011 |

(Continued)

*Primary Examiner* — Jarrett Stark
(74) *Attorney, Agent, or Firm* — Liu & Liu (57) ABSTRACT

An embodiment of the invention provides a chip package which includes: a semiconductor substrate; a device region formed in the semiconductor substrate; at least a conducting pad disposed over a surface of the semiconductor substrate; a protection plate disposed over the surface of the semiconductor substrate; and a spacer layer disposed between the surface of the semiconductor substrate and the protection plate, wherein the protection plate and the spacer layer surround a cavity over the device region, the spacer layer has an outer side surface away from the cavity, and the outer side surface of the spacer layer is not a cutting surface.

22 Claims, 9 Drawing Sheets

(56) References Cited

U.S. PATENT DOCUMENTS

| | | | |
|---|---|---|---|
| 2007/0190747 A1* | 8/2007 | Humpston | B81C 1/00285 438/460 |
| 2008/0237823 A1* | 10/2008 | Martin | 257/685 |
| 2009/0029526 A1* | 1/2009 | Chang-Chien et al. | 438/462 |
| 2010/0084752 A1* | 4/2010 | Horning et al. | 257/682 |
| 2013/0119556 A1* | 5/2013 | Liu et al. | 257/774 |
| 2013/0307137 A1* | 11/2013 | Lin et al. | 257/734 |
| 2013/0341747 A1* | 12/2013 | Lin et al. | 257/432 |
| 2015/0003482 A1* | 1/2015 | Monadgemi et al. | 372/44.01 |

FOREIGN PATENT DOCUMENTS

| | | |
|---|---|---|
| TW | 201127086 | 8/2011 |
| TW | 201236117 | 9/2012 |
| TW | 201241908 | 10/2012 |

\* cited by examiner

CHIP PACKAGE AND METHOD FOR FORMING THE SAME

CROSS REFERENCE TO RELATED APPLICATIONS

This Application claims the benefit of U.S. Provisional Application No. 61/774,368 filed on Mar. 7, 2013, the entirety of which is incorporated by reference herein.

BACKGROUND

1. Field of the Disclosure

The disclosure relates to a chip package, and in particular to a chip package formed by a wafer-level packaging process.

2. Description of the Related Art

A packaging process for chip packages is one important step in forming electronic products. A chip package not only provides the chips with protection from environmental contaminants, but it also provides an electrical connection interface for internal electronic elements and the chips packaged therein.

Finding ways to reduce the chip package size, to improve the throughput of the chip package, to ensure the quality of the chip package, to prevent the devices from being damaged during the packaging process, and to reduce the fabrication cost and fabrication time have become important issues.

BRIEF SUMMARY OF THE DISCLOSURE

An embodiment of the invention provides a chip package which includes: a semiconductor substrate; a device region formed in the semiconductor substrate; at least a conducting pad disposed on a surface of the semiconductor substrate; a protection plate disposed on the surface of the semiconductor substrate; and a spacer layer disposed between the surface of the semiconductor substrate and the protection plate, wherein the protection plate and the spacer layer surround a cavity on the device region, the spacer layer has an outer side surface away from the cavity, and the outer side surface of the spacer layer is not a cutting surface.

An embodiment of the invention provides a method for forming a chip package, which includes: providing a semiconductor substrate, wherein at least one device region is formed in the semiconductor substrate, and at least one conducting pad is disposed over a surface of the semiconductor substrate; providing a protection substrate; disposing a spacer layer over the surface of the semiconductor substrate or over the protection substrate; disposing a sacrificial support layer over the surface of the semiconductor substrate or over the protection substrate; disposing the protection substrate over the surface of the semiconductor substrate such that the protection substrate and the spacer layer surround a cavity over the at least one device region; and dicing and removing a portion of the protection substrate and a portion of the sacrificial support layer to expose the at least one conducting pad.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

DETAILED DESCRIPTION OF THE DISCLOSURE

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

A chip package according to an embodiment of the present invention may be used to package a variety of chips. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the afore mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

Figure 1A:
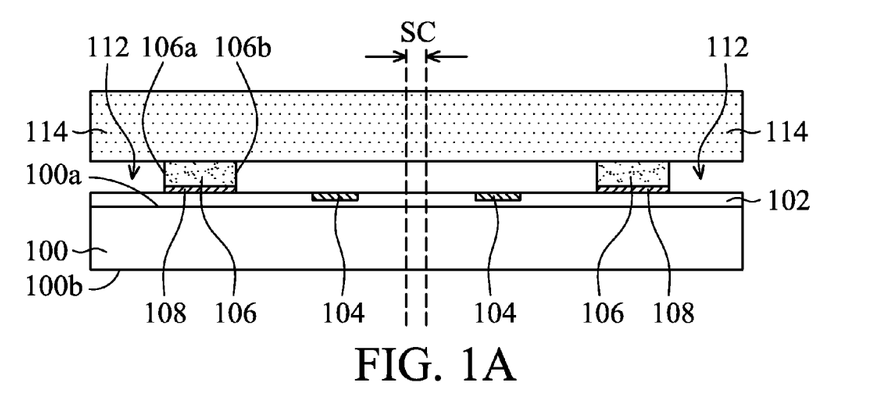
FIGS. 1A-1D are cross-sectional views showing the steps of forming a chip package according to an embodiment of the present invention.

FIGS. 1A-1D are cross-sectional views showing the steps of forming a chip package according to an embodiment of the present invention. As shown in FIG. 1A, a semiconductor substrate 100 may be provided, which has a surface 100a and a surface 100b. A dielectric layer 102 and at least one conducting pad 104 may be disposed over the surface 100a. Afterwards, a protection substrate 114 may be provided, and the protection substrate 114 may be disposed over the surface 100a of the semiconductor substrate 100. In one embodiment, a spacer layer 106 may be disposed between the semiconductor substrate 100 and the protection substrate 114. The spacer layer 106 and the protection substrate 114 may together surround at least one cavity 112 over the semiconductor substrate 100. The spacer layer 106 has an outer side surface 106b away from the cavity 112 and an inner side surface 106a near the cavity 112. The spacer layer 106 may be bonded over the dielectric layer 102 over the semiconductor substrate 100 through an adhesion layer 108. As shown in FIG. 1A, in one embodiment, there is at least one predetermined scribe line SC defined in the semiconductor substrate 100, which divides the semiconductor substrate into a plurality of die regions. After a subsequent dicing process is performed along the predetermined scribe line SC, a plurality of chip packages separated from each other are formed.

Figure 1B:
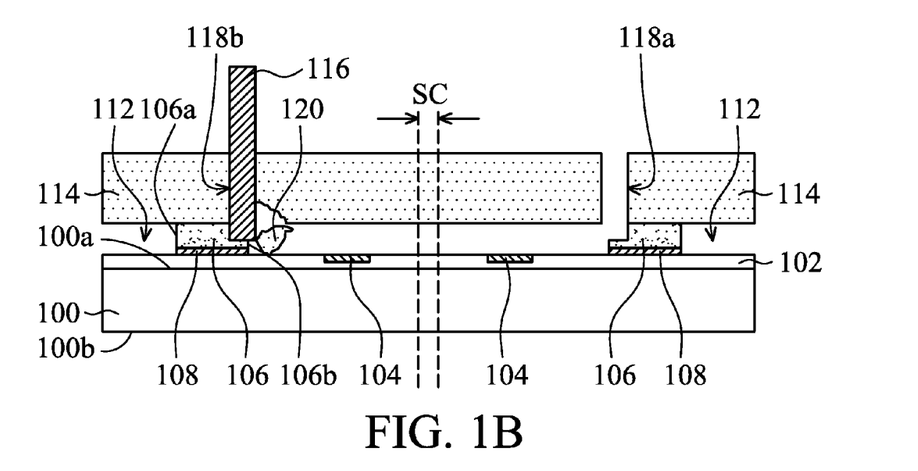

As shown in FIG. 1B, before the dicing process is performed along the predetermined scribe line SC, a dicing blade 116 may be aligned with the spacer layer 106 to cut and remove a portion of the protection substrate 114 and form trenches beside the predetermined scribe line SC, such as a trench 118a and a trench 118b. In one embodiment, after the trench 118a is formed, a portion of the protection substrate 114 and a portion of the spacer layer 116 are cut and removed to form the trench 118b by the dicing blade 116. Because a portion of the protection substrate 114 has been removed to form the trench 118a, it may be easy for the protection substrate 114 to be vibrated or to form a fragment 120 since the support is not sufficient during the protection substrate 114 is diced to form the trench 118b. In one embodiment, a surface roughness of the sidewall of the trench 118a is less than a surface roughness of the sidewall of the trench 118b. The fragment 120 may scratch the conducting pad 104 to lower the quality of the chip package.

Figure 1C:
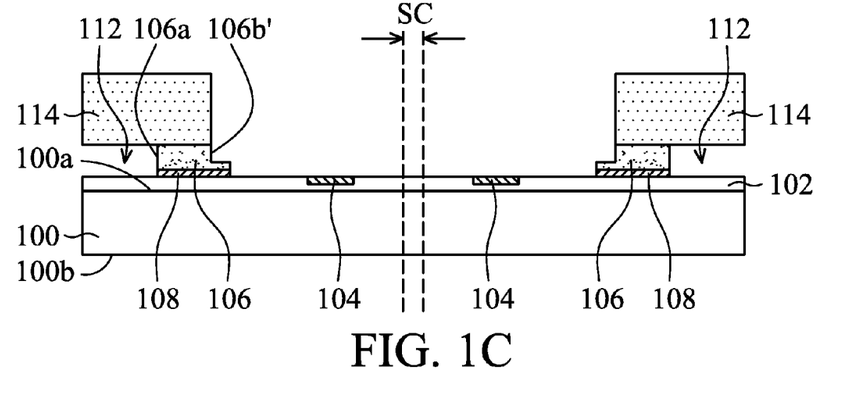
Figure 1D:
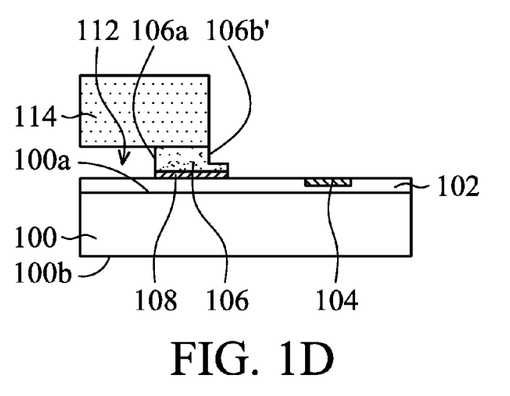

As shown in FIG. 1C, after a portion of the protection substrate 114 and a portion of the spacer layer 106 are diced and removed, the protection substrate 114 between the trenches may be removed to expose the conducting pads 104 beside the predetermined scribe line SC. The exposed conducting pads 104 may be used to be electrically connected to other conducting structures (such as solder wires or conducting bumps). In addition, because the spacer layer 106 is partially diced, the outer side surface 106b' includes a diced surface, which has dicing scratches. For example, an optical microscopy or an electron microscopy may be used to observe the dicing scratches on the outer side surface 106b'. Afterwards, a dicing process may be performed along the predetermined scribe line SC to form a plurality of chip packages separated from each other, wherein FIG. 1D shows one of the chip packages.

Figure 2A:
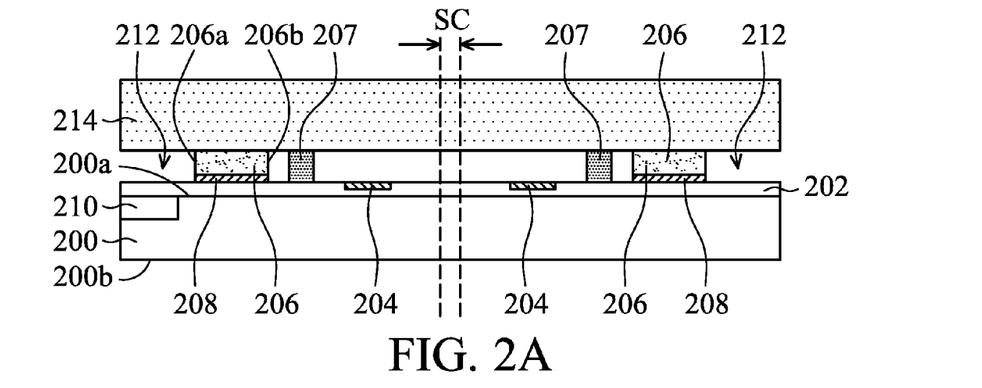
FIGS. 2A-2C are cross-sectional views showing the steps of forming a chip package according to an embodiment of the present invention.
Figure 2B:
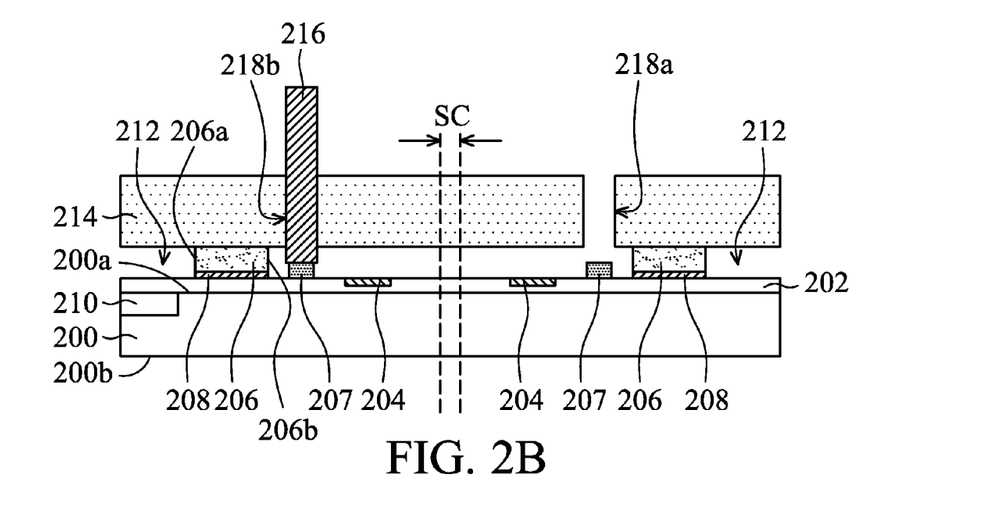
Figure 2C:
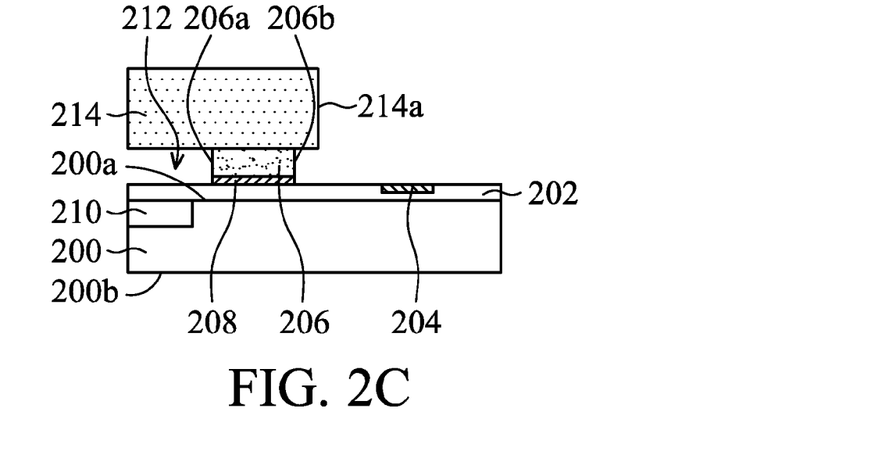

FIGS. 2A-2C are cross-sectional views showing the steps of forming a chip package according to an embodiment of the present invention. As shown in FIG. 2A, a semiconductor substrate 200 may be provided, which has a surface 200a and a surface 200b. The semiconductor substrate 200 may include a semiconductor wafer such as a silicon wafer. There may be at least one predetermined scribe line is defined in the semiconductor substrate 200, which divides the semiconductor substrate 200 into a plurality of die regions. In one embodiment, at least one device region 210 is formed in the semiconductor substrate 200. For example, there may be one device region 210 is formed in each of the die regions. A variety of devices may be formed in the device region 210, which are, for example, (but not limited to) sensor devices (such as image sensor devices) or light emitting devices.

A dielectric layer 202 and at least one conducting pad 204 may optionally be disposed over the surface 200a of the semiconductor substrate 200. The conducting pad 204 may be electrically connected to the devices in the device region 210. For example, a plurality of conducting pads 204 may be disposed around the periphery of the die region, which may be electrically connected to respective devices in the device region 210. The conducting pads 204 are electrically connected to the device region 202 through conductive lines (not shown) formed in the dielectric layer 202. The material of the dielectric layer 202 is, for example, (but not limited to) silicon oxide, silicon nitride, silicon oxynitride, or a combination thereof.

Afterwards, a protection substrate 214 may be provided, and the protection substrate 214 may be disposed over the surface 200a of the semiconductor substrate 200. The protection substrate 214 may be a transparent substrate such as (but not limited to) a glass substrate, a quartz substrate, a transparent polymer substrate, a sapphire substrate, or a combination thereof. The protection substrate 214 may have a shape and a size substantially the same as those of the semiconductor substrate 200.

In one embodiment, a spacer layer 206 may be disposed between the semiconductor substrate 200 and the protection substrate 214. The spacer layer 206 and the protection substrate 214 may together surround at least one cavity 212 over the at least one device region 210 of the semiconductor substrate 200. Alternatively, a plurality of spacer layers 206 may be disposed between the semiconductor substrate 200 and the protection substrate 214. Each of the spacer layers 206 surrounds a cavity 212 over each of the device regions 210, respectively. The spacer layer 206 has an outer side surface 206b away from the cavity 212 and an inner side surface 206a near the cavity 212. The material of the spacer layer 206 may include (but not limited to) a polymer material, a metal material, a ceramic material, a semiconductor material, or a combination thereof. In one embodiment, the spacer layer 206 may be constructed by a polymer material which is patterned through an exposure and development processes. The material of the spacer layer 206 is, for example, epoxy resin, polyimide, or a combination thereof.

The spacer layer 206 may be disposed between the semiconductor substrate 200 and the protection substrate 214 by a variety of methods. For example, in one embodiment, a spacer material layer (not shown) may be formed over the protection substrate 214. Afterwards, the spacer material layer may be patterned to form the spacer layer 206. Therefore, the spacer layer 206 may be in direct contact with the protection substrate 214. Then, the protection substrate 214 may be disposed over the surface 200a of the semiconductor substrate 200 such that the protection substrate 214 and the spacer layer 206 surround the cavity 212 over the device region 210. In one embodiment, the cavity 212 is a substantially closed cavity. In one embodiment, an adhesion layer 208 may be optionally disposed between the spacer layer 206 and the semiconductor substrate 200. For example, the adhesion layer 208 may be formed in advance over the dielectric layer 202 over the semiconductor substrate 200. When the protection substrate 214 is disposed over the semiconductor substrate 200, the spacer layer 206 may be in contact with the adhesion layer 208 so as to be bonded with the semiconductor substrate 200. Alternatively, in another embodiment, the spacer layer 206 may be formed in advance over the semiconductor substrate 200. After the protection substrate 214 is disposed, the spacer layer 206 is bonded with the protection substrate 214 and surrounds the cavity 212 over the device region 210.

As shown in FIG. 2A, the horizontal position of the spacer layer 206 may be positioned between the horizontal position of the device region 210 and the horizontal position of the conducting pad 204. The spacer layer 206 is closer to the device region 210 than the conducting pad 204. In one embodiment, the protection of the spacer layer 206 on the surface 200a of the semiconductor substrate 200 does not overlap with the protection of the conducting pad 204 on the surface 200a of the semiconductor substrate 200.

As shown in FIG. 2A, in one embodiment, a sacrificial support layer 207 may be formed between the semiconductor substrate 200 and the protection substrate 214. Similar to the formation method of the spacer layer 206, the sacrificial support layer 207 may be formed in advance over the protection substrate 214. Afterwards, the protection substrate 214 is disposed over the semiconductor substrate 200. Alternatively, in one embodiment, the sacrificial support layer 207 is formed in advance over the semiconductor substrate 200. Then, the protection substrate 214 is disposed over the semiconductor substrate 200.

In one embodiment, before the protection substrate 214 is disposed over the semiconductor substrate 200, the spacer layer 206 and the sacrificial support layer 207 may be formed in advance over the surface of the protection substrate 214 facing the semiconductor substrate 200. In one embodiment, the spacer layer 206 and the sacrificial support layer 207 may be simultaneously formed over the protection substrate 214. For example, the spacer layer 206 and the sacrificial support layer 207 are patterned from the same material layer. Therefore, they have the same material and are formed simultaneously. Afterwards, the protection substrate 214 is disposed over the surface 200a of the semiconductor substrate 200. The spacer layer 206 may be in contact with the adhesion layer 208 over the semiconductor substrate 200 so as to be bonded onto the dielectric layer 202. In one embodiment, it should be appreciated that the adhesion layer 208 is only disposed between the spacer layer 206 and the semiconductor substrate 200. There is no adhesion layer disposed between the sacrificial support layer 207 and the surface 200a of the semiconductor substrate 200. In one embodiment, the sacrificial support layer 207 is only in contact with the dielectric layer 202 over the semiconductor substrate 200. The sacrificial support layer 207 and the dielectric layer 202 do not adhere to each other.

Figure 6:
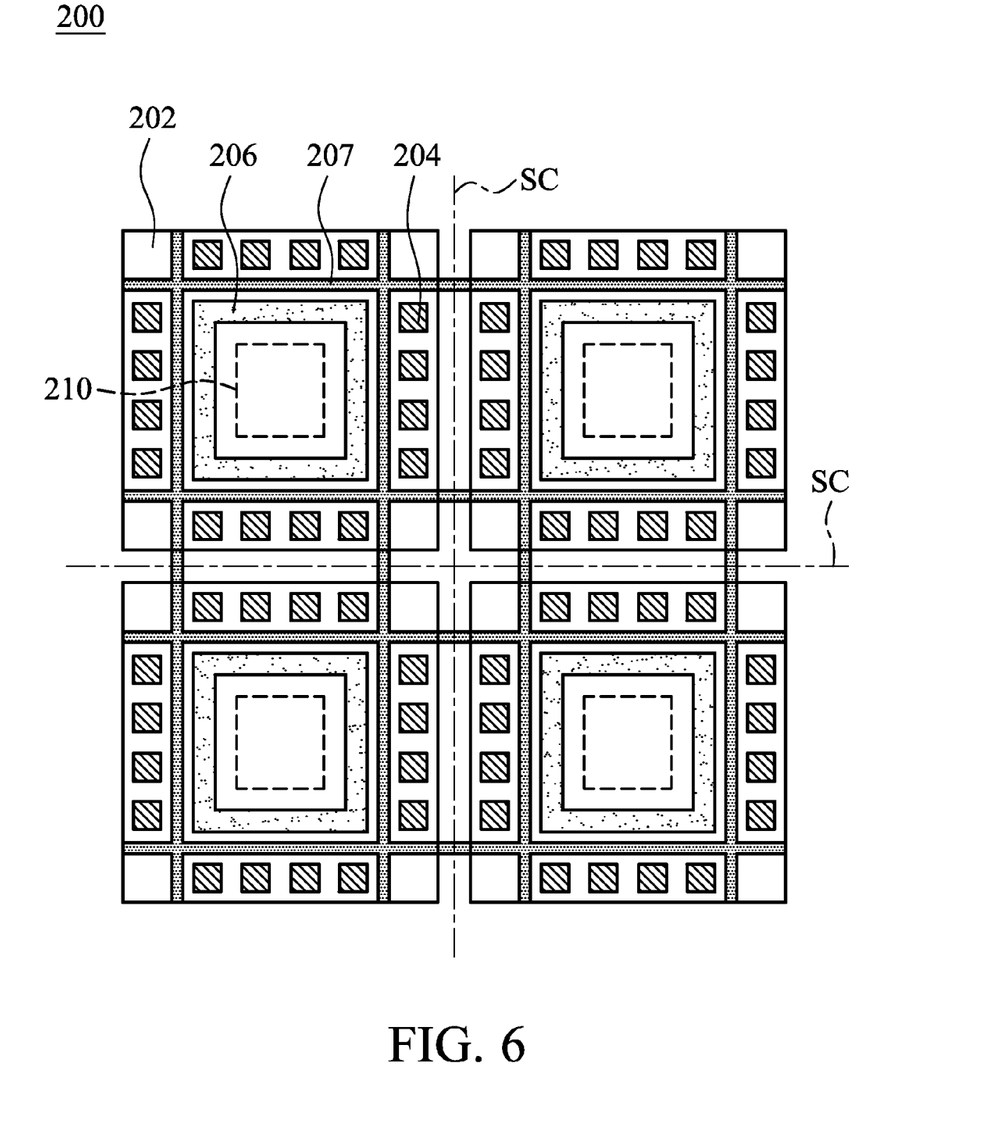
FIG. 6 is a top view of a semiconductor substrate at a stage during a process for forming a chip package according to an embodiment of the present invention.
Figure 7:
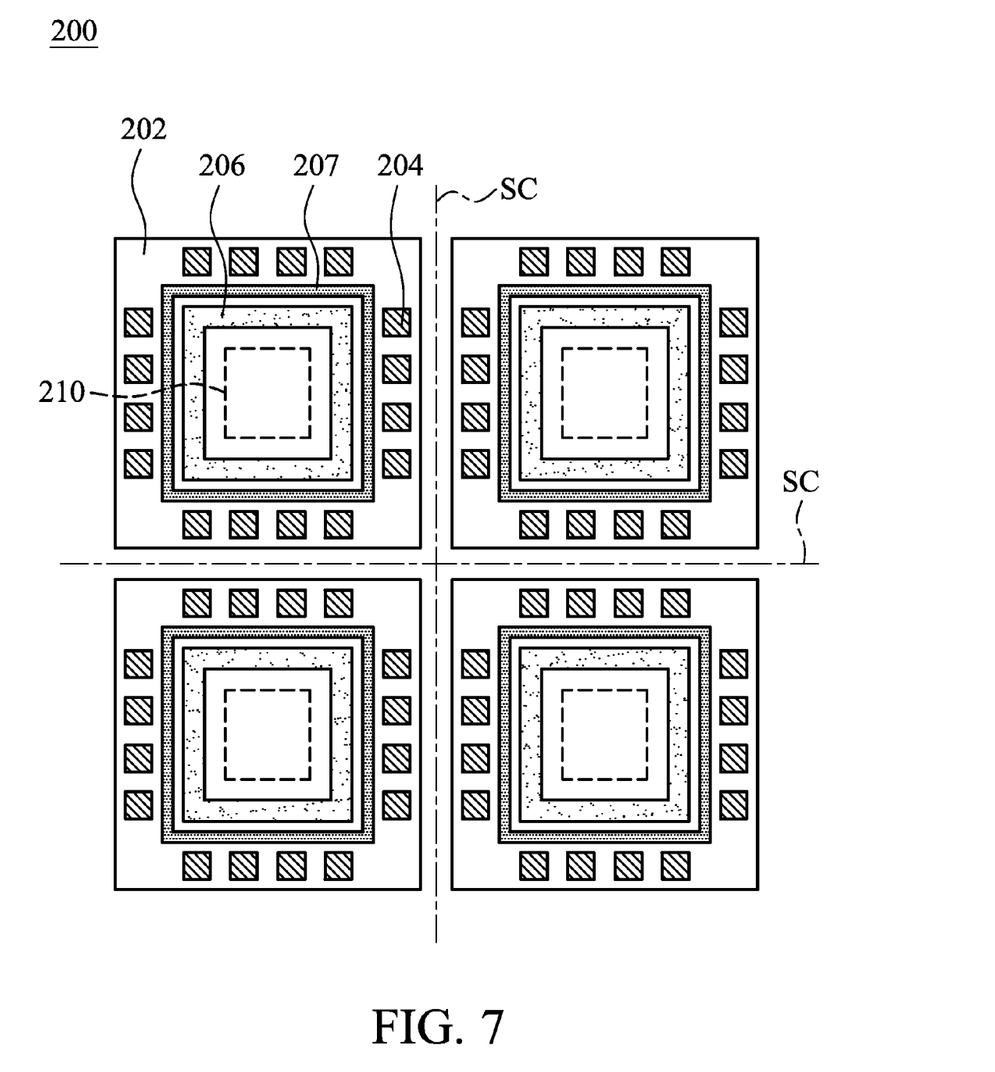
FIG. 7 is a top view of a semiconductor substrate at a stage during a process for forming a chip package according to an embodiment of the present invention.

FIG. 7 is a top view of a semiconductor substrate at a stage during a process for forming a chip package according to an embodiment of the present invention, which may correspond to the top view of the semiconductor substrate 200 of FIG. 2A. As shown in FIG. 7, the sacrificial support layer 207 may surround the spacer layer 206 and the device region 210. In one embodiment, a plurality of sacrificial support layers 207 are formed over the semiconductor substrate 200, which surround the corresponding spacer layer 206 and the corresponding device region 210, respectively. FIG. 6 is a top view of a semiconductor substrate at a stage during a process for forming a chip package according to another embodiment of the present invention, which may correspond to the top view of the semiconductor substrate 200 of FIG. 2A in another embodiment. As shown in FIG. 6, the sacrificial support layer 207 may further extend across the predetermined scribe line SC and extend into a neighboring die region. The sacrificial support layer 207 facilitates the subsequent dicing process and prevents the conducting pads 204 from being damaged.

As shown in FIG. 2B, before the dicing process is performed along the predetermined scribe line SC, a dicing blade 216 may be aligned with the sacrificial support layer 207 to cut and remove a portion of the protection substrate 214 and a portion of the sacrificial support layer 207 and form trenches beside the predetermined scribe line SC, such as a trench 218a and a trench 218b. In one embodiment, after the trench 218a is formed, a portion of the protection substrate 214 and a portion of the sacrificial support layer 207 are cut and removed to form the trench 218b by the dicing blade 116. Because the protection substrate 214 may be supported by the sacrificial support layer 207 thereunder during the protection substrate 214 is diced to form the trench 218b, the vibration of the protection substrate 214 may be reduced. It may be effectively prevented or reduced for the protection substrate 214 to be damaged and form fragments. Therefore, the conducting pads 204 may be prevented from being damaged.

After a portion of the protection substrate 214 and a portion of the sacrificial support layer 207 are diced and removed, the protection substrate 214 between the trenches may be removed to expose the conducting pads 104 beside the predetermined scribe line SC. The exposed conducting pads 204 may be used to be electrically connected to other conducting structures (such as solder wires or conducting bumps). In addition, because the sacrificial support layer 207 and the dielectric layer 202 do not adhere to each other, the remaining portion of the sacrificial support layer 207 is no longer firmly fixed on the surface 200a of the semiconductor substrate 200 after a portion of the protection substrate 214 and a portion of the sacrificial support layer 207 are diced and removed. As a result, the sacrificial support layer 207 and the semiconductor substrate 200 may be separated from each other.

Afterwards, as shown in FIG. 2C, a dicing process may be performed along the predetermined scribe line SC to form a plurality of chip packages separated from each other, wherein FIG. 2C shows one of the chip packages. A side surface 214a of the protection substrate 214 may protrude from the outer side surface 206b of the spacer layer 206. In one embodiment, because the previously performed step of dicing and removing a portion of the protection substrate 214 and a portion of the sacrificial support layer 207 does not include dicing and removing the spacer layer 206, the outer side surface 206b of the spacer layer 206 away from the cavity 212 is not a cutting surface. In one embodiment, no scratch caused by a dicing blade can be found on the outer side surface 206b. In one embodiment, the roughness of the inner side surface 206a of the spacer layer 206 is substantially the same as the roughness of the outer side surface 206b of the spacer layer 206. In one embodiment, the inner side surface 206a and the outer side surface 206b of the spacer layer 206 are parallel to each other.

Figure 3:
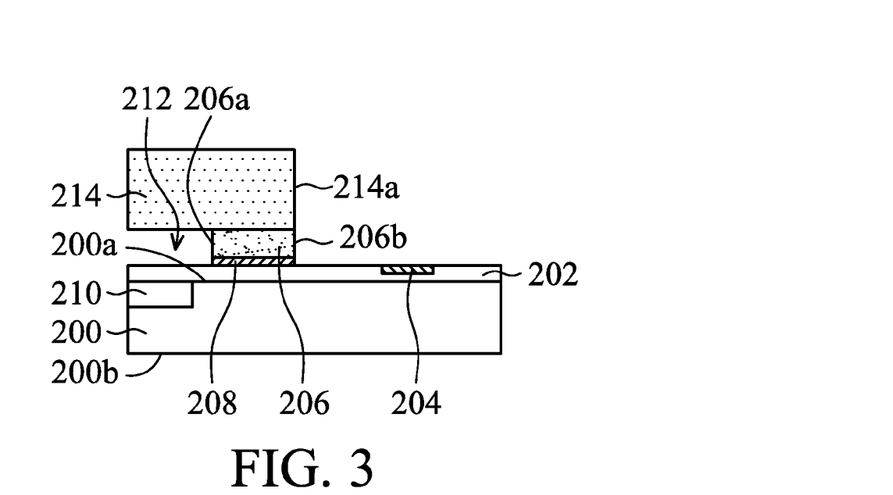
FIG. 3 is a cross-sectional view of a chip package according to an embodiment of the present invention.

FIG. 3 is a cross-sectional view of a chip package according to an embodiment of the present invention, wherein the same or similar reference numbers are used to designate the same or similar elements. The embodiment shown in FIG. 3 is similar to the embodiment shown in FIG. 2. The main difference is that the side surface 214a of the protection substrate 214 may not protrude from the outer side surface 206b of the spacer layer 206 and may be coplanar with the outer side surface 206b.

Figure 4A:
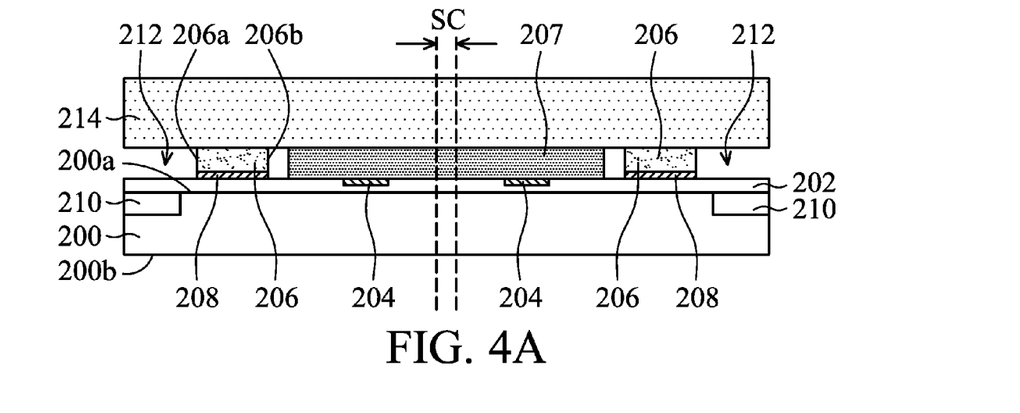
FIGS. 4A-4C are cross-sectional views showing the steps of forming a chip package according to an embodiment of the present invention.
Figure 4B:
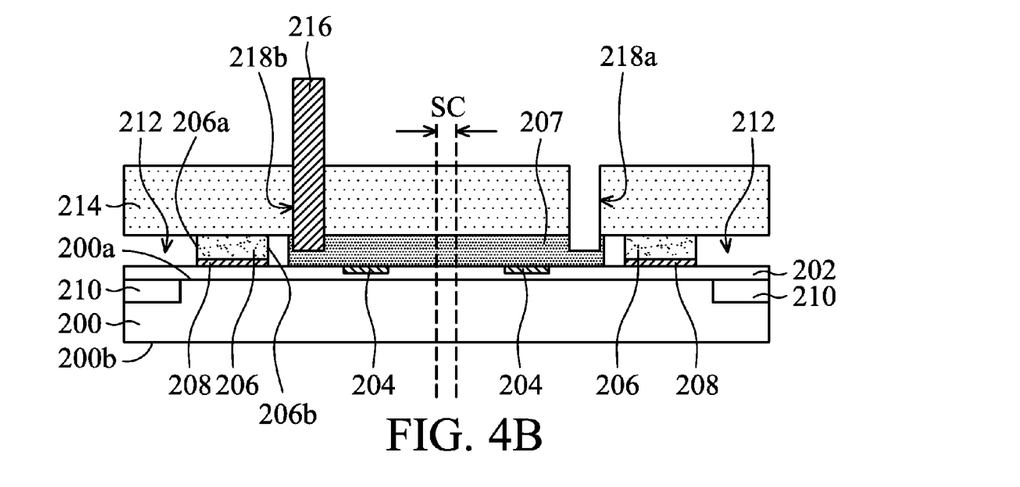
Figure 4C:
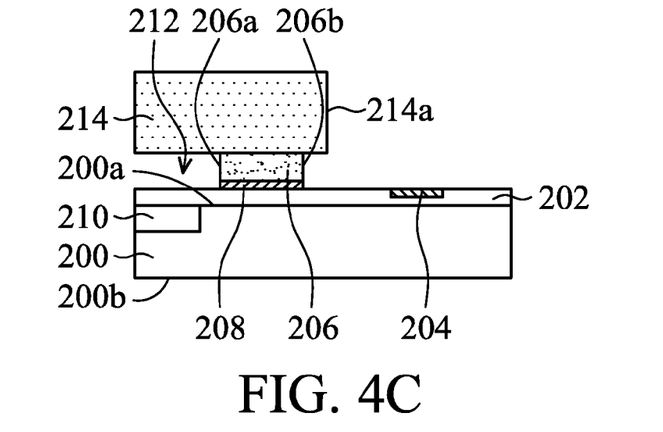

FIGS. 4A-4C are cross-sectional views showing the steps of forming a chip package according to an embodiment of the present invention, wherein same or similar reference numbers are used to designate same or similar elements. As shown in FIG. 4A, the structure shown in FIG. 4A may be formed by using a method similar to that illustrated in the embodiment shown in FIG. 2. The main difference is that the sacrificial support layer 207 may further extend across the predetermined scribe line SC and cover the conducting pads 204 beside the predetermined scribe line SC.

Figure 8:
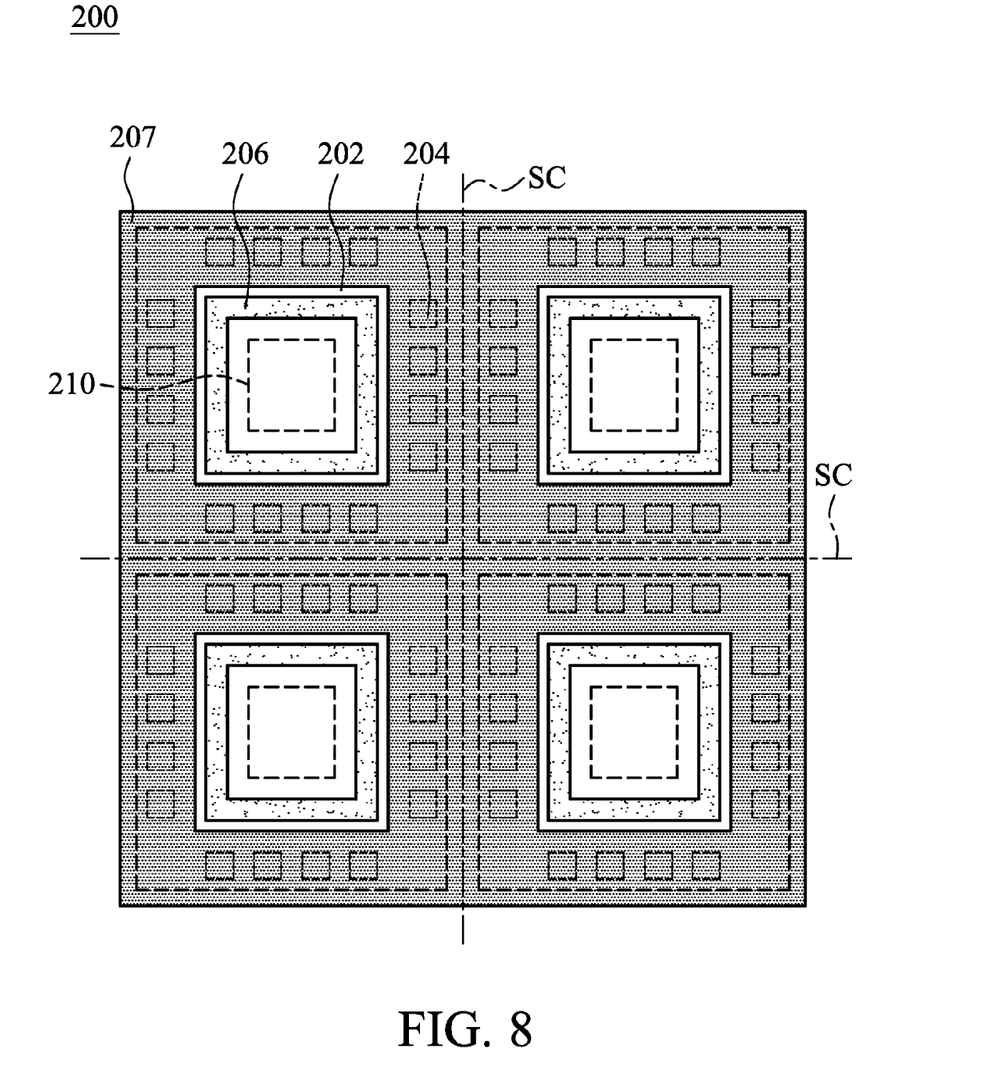
FIG. 8 is a top view of a semiconductor substrate at a stage during a process for forming a chip package according to an embodiment of the present invention.

FIG. 8 is a top view of a semiconductor substrate at a stage during a process for forming a chip package according to an embodiment of the present invention, which may correspond to the top view of the semiconductor substrate 200 of FIG. 4A. As shown in FIG. 8, the sacrificial support layer 207 may surround the spacer layer 206 and the device region 210 and cover the conducting pads 204 and the predetermined scribe line SC.

Afterwards, as shown in FIG. 4B, a portion of the protection substrate 214 and a portion of the sacrificial support layer 207 may be diced and removed to form at least two trenches 218a and 218b. Due to the support of the sacrificial support layer 207, the protection substrate 214 may not be substantially damaged during the dicing process. In addition, because the sacrificial support layer 207 covers the conducting pad 204, more protection is provided to the conducting pad 204 to prevent damage. In one embodiment, because the sacrificial support layer 207 also does not adhere to the dielectric layer 202 and the conducting pad 204, a portion of the protection substrate 214 and all of the sacrificial support layer 207 may be removed easily to expose the conducting pad 204 after the trenches are formed.

Figure 5:
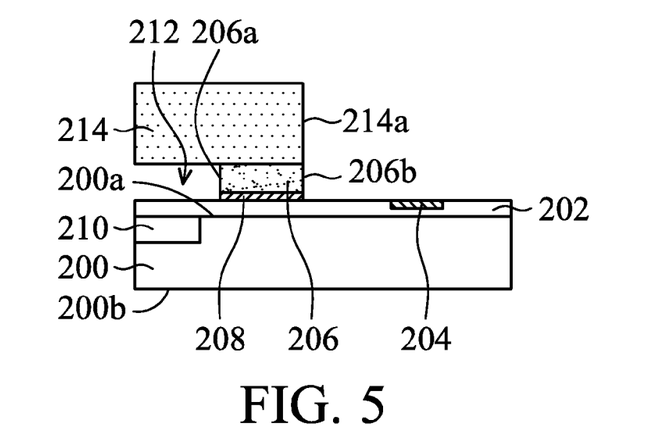
FIG. 5 is a cross-sectional view of a chip package according to an embodiment of the present invention.

As shown in FIG. 4C, a dicing process may then be performed along the predetermined scribe line SC to form at least one chip package. The side surface 214a of the protection substrate 214 may protrude from the outer side surface 206b of the spacer layer 206. In another embodiment, as shown in FIG. 5, through the adjustment of the dicing position of the dicing blade, the side surface 214a of the protection substrate 214 and the outer side surface 206b of the spacer layer 206 may be substantially coplanar.

In the embodiments of the invention, the formation of the sacrificial support layer substantially does not increase any additional process (since the sacrificial support layer may be chosen to be simultaneously formed with the spacer layer). In addition, the sacrificial support layer may be easily removed. Through the formation of the sacrificial support layer, the chip packaging process may be performed smoothly. The quality of the chip package may be ensured.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a semiconductor substrate;
a device region formed in the semiconductor substrate;
at least one conducting pad disposed over a surface of the semiconductor substrate;
a protection substrate disposed over the surface of the semiconductor substrate;
a spacer layer disposed between the surface of the semiconductor substrate and the protection substrate, wherein the protection substrate and the spacer layer surround a cavity over the device region, the spacer layer has an outer side surface away from the cavity, and the outer side surface of the spacer layer is not a cutting surface;
a dielectric layer disposed between the surface of the semiconductor substrate and the spacer layer, wherein the dielectric layer covers the device region and the spacer layer is disposed over the dielectric layer; and
a portion of a sacrificial support layer disposed on the dielectric layer, wherein the portion of the sacrificial support layer is located between the spacer layer and a conducting pad of the at least one conducting pad which is closest to the spacer layer, and the portion of the sacrificial support layer is not in contact with the spacer layer.

2. The chip package as claimed in claim 1, wherein the spacer layer has an inner side surface near the cavity, wherein the surface roughness of the inner side surface of the spacer layer is substantially the same as the surface roughness of the outer side surface of the spacer layer.

3. The chip package as claimed in claim 2, wherein the inner side surface and the outer side surface of the spacer layer are parallel to each other.

4. The chip package as claimed in claim 1, wherein a side surface of the protection substrate protrudes from the outer side surface of the spacer layer.

5. The chip package as claimed in claim 1, wherein the spacer layer is closer to the device region than the at least one conducting pad.

6. The chip package as claimed in claim 1, wherein a projection of the spacer layer on the surface of the semiconductor substrate does not overlap with a protection of the at least one conducting pad on the surface of the semiconductor substrate.

7. The chip package as claimed in claim 1, wherein the spacer layer is in direct contact with the protection substrate.

8. The chip package as claimed in claim 1, wherein the protection substrate is a transparent substrate.

9. The chip package as claimed in claim 1, wherein the cavity is a substantially closed cavity.

10. The chip package as claimed in claim 1, further comprising an adhesion layer disposed between the spacer layer and the semiconductor substrate.

11. A method for forming a chip package, comprising:
providing a semiconductor substrate, wherein at least one device region is formed in the semiconductor substrate, and at least one conducting pad is disposed over a surface of the semiconductor substrate;

disposing a dielectric layer over the semiconductor substrate, wherein the dielectric layer covers the device region;

providing a protection substrate;

disposing a spacer layer over the surface of the dielectric layer or over the protection substrate;

disposing a sacrificial support layer over the surface of the dielectric layer or over the protection substrate;

disposing the protection substrate over the surface of the semiconductor substrate such that the protection substrate and the spacer layer surround a cavity over the at least one device region and the dielectric layer is disposed between the surface of the semiconductor substrate and the spacer layer; and dicing and removing a portion of the protection substrate and a portion of the sacrificial support layer to expose the at least one conducting pad, wherein the spacer layer has an outer side surface away from the cavity, and the outer side surface of the spacer layer is not a cutting surface, wherein the portion of the sacrificial support layer is located between the spacer layer and a conducting pad of the at least one conducting pad which is closest to the spacer layer, and the portion of the sacrificial support layer is not in contact with the spacer layer.

12. The method for forming a chip package as claimed in claim 11, further comprising performing a dicing process along at least one predetermined scribe line of the semiconductor substrate to form a plurality of chip packages separated from each other.

13. The method for forming a chip package as claimed in claim 12, wherein the dicing process is performed after the step of dicing and removing the portion of the protection substrate and the portion of the sacrificial support layer to expose the at least one conducting pad.

14. The method for forming a chip package as claimed in claim 12, wherein the sacrificial support layer surrounds the spacer layer and the at least one device region.

15. The method for forming a chip package as claimed in claim 14, wherein the sacrificial support layer extends across the at least one predetermined scribe line.

16. The method for forming a chip package as claimed in claim 15, wherein the sacrificial support layer covers the at least one conducting pad.

17. The method for forming a chip package as claimed in claim 11, wherein the step of dicing and removing the portion of the protection substrate and the portion of the sacrificial support layer to expose the at least one conducting pad does not comprise dicing and removing a portion of the spacer layer.

18. The method for forming a chip package as claimed in claim 11, wherein before the step of disposing the protection substrate over the surface of the semiconductor substrate, the steps of forming the spacer layer over the protection substrate, and of bonding the spacer layer onto the surface of the semiconductor substrate through an adhesion layer are performed.

19. The method for forming a chip package as claimed in claim 11, wherein before the step of disposing the protection substrate over the surface of the semiconductor substrate, the step of forming the sacrificial support layer over the protection substrate is performed, and there is no adhesion layer disposed between the sacrificial support layer and the surface of the semiconductor substrate.

20. The method for forming a chip package as claimed in claim 19, wherein after the step of dicing and removing the portion of the protection substrate and the portion of the sacrificial support layer, a remaining portion of the sacrificial support layer is no longer fixed over the surface of the semiconductor substrate such that the sacrificial support layer and the semiconductor substrate are separated from each other.

21. The method for forming a chip package as claimed in claim 11, wherein the spacer layer and the sacrificial support layer are simultaneously formed over the protection substrate.

22. A chip package, comprising:
a semiconductor substrate;
a device region formed in the semiconductor substrate;
at least one conducting pad disposed over a surface of the semiconductor substrate;
a protection substrate disposed over the surface of the semiconductor substrate;
a spacer layer disposed between the surface of the semiconductor substrate and the protection substrate, wherein the protection substrate and the spacer layer surround a cavity over the device region, the spacer layer has an outer side surface away from the cavity, and the outer side surface of the spacer layer is not a cutting surface;
a dielectric layer disposed between the surface of the semiconductor substrate and the spacer layer, wherein the dielectric layer covers the device region and the space layer is disposed over the dielectric layer; and
a portion of a sacrificial support layer disposed on the dielectric layer, wherein the portion of the sacrificial support layer is located between the spacer layer and a conducting pad of the at least one conducting pad closest to the spacer layer, and a gap is between the portion of the sacrificial support layer and the spacer layer.

* * * * *